US009799387B1

(12) United States Patent
Toh et al.

(10) Patent No.: US 9,799,387 B1
(45) Date of Patent: Oct. 24, 2017

(54) INTEGRATED CIRCUITS WITH PROGRAMMABLE MEMORY CELLS AND METHODS FOR PROGRAMMING THE SAME

(71) Applicant: Globalfoundries Singapore Pte. Ltd., Singapore (SG)

(72) Inventors: Eng Huat Toh, Singapore (SG); Kangho Lee, Singapore (SG); Kiok Boone Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/386,200

(22) Filed: Dec. 21, 2016

(51) Int. Cl.
*G11C 11/16* (2006.01)

(52) U.S. Cl.
CPC .......... *G11C 11/1675* (2013.01); *G11C 11/16* (2013.01)

(58) Field of Classification Search
CPC .................................. G11C 11/16; G11C 11/15
USPC .................................................. 365/158, 173
See application file for complete search history.

(56) References Cited

U.S. PATENT DOCUMENTS

| 7,113,424 | B2 * | 9/2006 | Happ | G11C 7/04 365/158 |
|---|---|---|---|---|
| 8,315,090 | B2 * | 11/2012 | Ong | 365/158 |
| 8,542,537 | B2 * | 9/2013 | Parker | G11C 16/10 365/185.24 |
| 2006/0154381 | A1 * | 7/2006 | Gaidis | G11C 11/16 438/3 |
| 2006/0226921 | A1 * | 10/2006 | Hsu | H03K 3/0315 331/57 |
| 2006/0280012 | A1 * | 12/2006 | Perner | G11C 7/04 365/212 |
| 2008/0089128 | A1 * | 4/2008 | Mokhlesi | G11C 11/5628 365/185.17 |
| 2008/0316792 | A1 * | 12/2008 | Philipp | G11C 11/5678 365/148 |
| 2009/0091979 | A1 * | 4/2009 | Shalvi | G11C 11/56 365/185.09 |
| 2009/0147572 | A1 * | 6/2009 | Aritome | G11C 11/5635 365/185.03 |
| 2009/0199043 | A1 * | 8/2009 | Schrogmeier | G06F 11/1048 714/6.13 |
| 2009/0296465 | A1 * | 12/2009 | Wang | G11C 7/04 365/185.2 |
| 2010/0002498 | A1 * | 1/2010 | Philipp | G11C 11/56 365/163 |
| 2010/0014345 | A1 * | 1/2010 | Cho | G11C 5/025 365/163 |
| 2012/0213005 | A1 * | 8/2012 | Lee | G11C 16/14 365/185.11 |
| 2013/0128659 | A1 * | 5/2013 | Prejbeanu | G11C 11/161 365/158 |

(Continued)

Primary Examiner — Michael Tran
(74) Attorney, Agent, or Firm — Lorenz & Kopf, LLP

(57) ABSTRACT

Integrated circuits with memory cells and methods of programming the memory cells are provided. In an exemplary embodiment, a method of programming a memory cell includes determining a memory cell temperature for a memory cell within an integrated circuit. A pulse number is determined, where the pulse number is the number of electrical pulses at a set voltage required to program the memory cell at the memory cell temperature. The memory cell is programmed with a write operation, where the write operation includes the pulse number of electrical pulses.

20 Claims, 3 Drawing Sheets

(56) References Cited

U.S. PATENT DOCUMENTS

| | | | | |
|---|---|---|---|---|
| 2013/0223143 A1* | 8/2013 | Cho | G11C 16/0483 | 365/185.03 |
| 2013/0343119 A1* | 12/2013 | Redaelli | G11C 13/004 | 365/163 |
| 2014/0136752 A1* | 5/2014 | Terada | G06F 12/0246 | 711/102 |
| 2014/0204678 A1* | 7/2014 | Mu | G11C 16/10 | 365/185.19 |
| 2014/0244897 A1* | 8/2014 | Goss | G06F 12/0246 | 711/103 |
| 2014/0269111 A1* | 9/2014 | He | G11C 16/08 | 365/189.011 |
| 2014/0321211 A1* | 10/2014 | Mu | G11C 16/3445 | 365/185.19 |
| 2014/0321212 A1* | 10/2014 | Mu | G11C 16/34 | 365/185.19 |
| 2015/0085593 A1* | 3/2015 | Mu | G11C 7/08 | 365/208 |
| 2015/0206567 A1* | 7/2015 | Bose | G11C 7/04 | 365/158 |
| 2015/0206569 A1* | 7/2015 | Bose | A61H 3/00 | 365/158 |
| 2016/0118131 A1* | 4/2016 | Dong | G11C 16/3427 | 365/185.02 |
| 2016/0124848 A1* | 5/2016 | Bellorado | G06F 12/0253 | 711/103 |
| 2016/0125922 A1* | 5/2016 | Chen | G11C 11/5628 | 365/189.16 |
| 2016/0125942 A1* | 5/2016 | Yoon | G11C 13/0069 | 365/148 |
| 2016/0132256 A1* | 5/2016 | Jung | G06F 3/0614 | 711/103 |
| 2016/0133319 A1* | 5/2016 | Fantini | G11C 13/003 | 365/163 |
| 2016/0155384 A1* | 6/2016 | Kim | G09G 3/3258 | 345/212 |
| 2016/0172044 A1* | 6/2016 | Lu | G11C 16/0466 | 365/185.11 |
| 2016/0260773 A1* | 9/2016 | Kitagawa | H01L 27/228 | |

* cited by examiner

US 9,799,387 B1

INTEGRATED CIRCUITS WITH PROGRAMMABLE MEMORY CELLS AND METHODS FOR PROGRAMMING THE SAME

TECHNICAL FIELD

The technical field generally relates to integrated circuits with programmable memory cells and methods of programming the memory cells, and more particularly relates to integrated circuits with magnetoresistive programmable memory cells and methods of programming the same.

BACKGROUND

Magnetoresistive Random Access Memory (MRAM) is an emerging technology that may be competitive with prior integrated circuit memory technologies, such as floating gate technology. The MRAM technology may integrate silicon-based electronic components with magnetic tunnel junction (MTJ) technology. A significant element in MRAM is the MTJ where information may be stored as memory. A MTJ stack has at least two magnetic layers separated by a non-magnetic barrier layer, where a first magnetic layer (the fixed layer) has a set magnetic property and a second magnetic layer (the free layer) has a programmable magnetic property. The MTJ stack can store information based upon the programmable state of the second (free) magnetic layer. "Programming," as used herein, refers to changing the state of a memory cell such that the stored information of the memory cell is changed. More particularly, if the fixed layer and the free layer have parallel magnetic poles, the resistance through the MTJ stack is measurably less than if the fixed layer and the free layer have anti-parallel poles, so parallel magnetic poles may be read as a "0" and anti-parallel poles may be read as a "1." Therefore, the MTJ stack and the memory cell are programmed by changing the alignment of the free layer relative to the fixed layer.

The free layer is programmed with electric current, but the properties of the required programming electric current depend on temperature. A larger electric current is required at a lower temperature. For example, to change the polarity of the free layer at a temperature of about 125 degrees Celsius (° C.), a word line voltage of about 1.7 volts combined with a source line voltage of about 0.7 volts may be required. However, to change the polarity at a temperature of about −40° C., a word line voltage about 2.1 volts and a source line voltage of about 0.8 volts may be required to deliver a larger current. Excessive voltage can damage the MTJ stack, and the voltage that can damage the MTJ stack depends on temperature. Therefore, consistent use of higher voltages is not acceptable. To address this issue, the temperature of the memory cell may be determined, and the required voltage for a write operation (a programming charge of electrical energy) is determined based on the temperature. Analog circuits are then activated to generate the write operation at the required voltage for the temperature. However, the analog circuits are complex, and have a relatively large footprint in an integrated circuit.

Accordingly, it is desirable to provide integrated circuits with memory cells that can be programmed with a substantially constant voltage write operation that is independent of temperature, and methods of producing the same. In addition, it is desirable to provide integrated circuits with magnetoresistive memory cells that can be programmed with digital circuits, as opposed to analog circuits, and methods of producing the same. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits with memory cells and methods of programming the memory cells are provided. In an exemplary embodiment, a method of programming a memory cell includes determining a memory cell temperature for a memory cell within an integrated circuit. A pulse number is determined, where the pulse number is the number of electrical pulses at a set voltage required to program the memory cell at the memory cell temperature. The memory cell is programmed with a write operation, where the write operation includes the pulse number of electrical pulses.

A method of programming a memory cell is provided in another embodiment. The method includes determining a memory cell temperature for a memory cell, and determining a pulse duration where the pulse duration is the duration of a write operation required to program the memory cell at the memory cell temperature. The memory cell is programmed with the write operation, where the write operation has a set voltage that is independent of the memory cell temperature, and where the write operation includes an electrical pulse at the pulse duration.

An integrated circuit is provided in another embodiment. The integrated circuit includes a memory cell and a memory cell temperature sensing element configured to determine a memory cell temperature. The integrated circuit further includes a write pulse determination process configured to generate a write pulse that includes one or more electrical pulses at a set voltage, where the set voltage is independent of the memory cell temperature.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits that include memory cells, and methods for programming the memory cells. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will be omitted entirely without providing the well-known process details.

Figure 1:
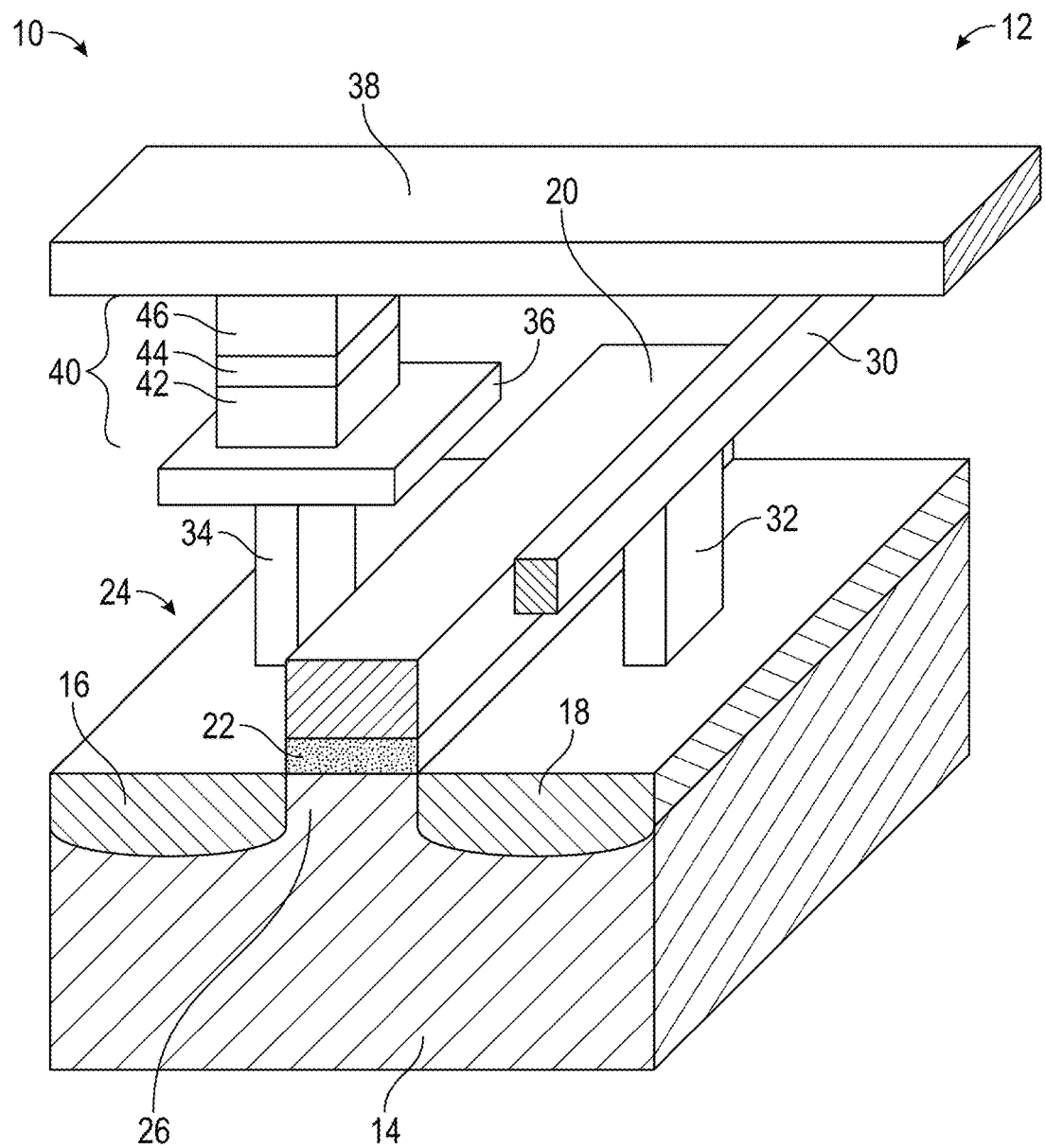
FIG. 1 is a sectional perspective view of a portion of an integrated circuit.

Referring to FIG. 1, an integrated circuit 10 includes a memory cell 12. The memory cell includes a substrate 14 with a source 16 and a drain 18, where the source 16 and drain 18 may be reversed or alternate in various embodiments. The substrate 14 includes a semiconductive material, and the source 16 and drain 18 are formed within the substrate 14 in the illustrated embodiment. In alternate embodiments (not illustrated), the source 16 and drain 18 may be formed overlying the substrate 14. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that "includes" a recited material includes the recited material in an amount of at least 10 weight percent or more based on the total weight of the material unless otherwise indicated. In many embodiments, the substrate 14 primarily includes a monocrystalline semiconductor material. The substrate 14 may be a bulk silicon wafer (as illustrated) or may be a thin layer of silicon on an insulating layer (commonly known as silicon-on-insulator or SOI, not illustrated) that, in turn, is supported by a carrier wafer. As used herein, the term "overlying" means "over" such that an intervening layer may lie between the source 16 and/or drain 18 and the substrate 14, or "on" such that the source 16 and/or drain 18 physically contacts the substrate 14.

A word line 20 overlies the substrate 14 between the source 16 and drain 18, and a gate insulator 22 underlies the word line 20, such that the gate insulator 22 is between the word line 20 and the substrate 14. The word line 20 includes an electrically conductive material and the gate insulator 22 includes an electrically insulating material. As used herein, an "electrically insulating material" is a material with a resistivity of about $1\times10^4$ ohm meters or more, an "electrically conductive material" is a material with a resistivity of about $1\times10^{-4}$ ohm meters or less, and an "electrically semiconductive material" is a material with a resistivity of from about more than $1\times10^{-4}$ ohm meters to less than about $1\times10^4$ ohm meters. In an exemplary embodiment, the word line 20 includes polysilicon doped with conductivity determining impurities, and the gate insulator 22 includes silicon dioxide, but other materials may be used in alternate embodiments. The word line 20 serves as gate for a memory cell transistor 24, and a channel 26 is defined within the substrate 14 directly underlying the word line 20 (which serves as the gate for the memory cell transistor 24). The memory cell transistor 24 includes the word line 20 (which serves as the gate), the gate insulator 22, the channel 26, the source 16, and the drain 18.

A source line 30 is electrically connected to the drain 18 by a source line contact 32, in an exemplary embodiment, where the source line 30 and the source line contact 32 are electrically conductive. The source line 30 and the source line contact 32 may include copper, tungsten, aluminum, polysilicon with conductivity determining impurities, or other materials in various embodiments. In an exemplary embodiment, the source line 30 includes copper, and the source line contact 32 includes tungsten, but other conductive materials could be used in alternate embodiments. The source line 30 and source line contact 32 may include the same materials in some embodiments, or they include different materials in other embodiments. In various embodiments, the source line 30 may be parallel to the word line 20, to a bit line 38 (described below), or in other orientations.

A bit line contact 34 is electrically connected to a base electrode 36 and to the source 16, where the bit line contact 34 and the base electrode 36 include electrically conductive materials, such as those described above for the source line contact 32. A magnetic tunnel junction (MTJ) stack 40 is positioned between a bit line 38 and the base electrode 36 in the illustrated embodiment, but there may be more than one bit line contact 34 and/or base electrode 36 in alternate embodiments as long as the source 16 is in electrical communication with the MTJ stack 40. The bit line 38 also includes an electrically conductive material. In the illustrated embodiment, the MTJ stack 40 includes a fixed layer 42 overlying the base electrode 36, a barrier layer 44 overlying the fixed layer 42, and a free layer 46 overlying the barrier layer 44 such that the barrier layer 44 physically separates the fixed and free layers 42, 46. The barrier layer 44 may include magnesium oxide in an exemplary embodiment, and may be from about 5 to about 20 angstroms thick. However, other materials and/or other thicknesses are possible in alternate embodiments. The barrier layer 44 is non-magnetic. The MTJ stack 40 is in electrical communication with the bit line 38, and the MTJ stack 40 is also in electrical communication to the word line 20 and to the source line 30 through the memory cell transistor 24.

The fixed layer 42 includes a magnetic material, such as cobalt, iron, platinum, palladium, or a combination thereof, but other magnetic materials may be used in alternate embodiments. The fixed layer 42 may also include one, two, or more individual magnetic layers that are separated by non-magnetic divider layers (not illustrated) in some embodiments. The free layer 46 also includes a magnetic material, as described above, and may also include individual magnetic layers that are separated by non-magnetic divider layers (not illustrated) in some embodiments. The fixed layer 42 has a magnetic field that is aligned along a pole, and the free layer 46 has a magnetic field that is parallel or anti-parallel with the magnetic field of the fixed layer 42.

Figure 2:
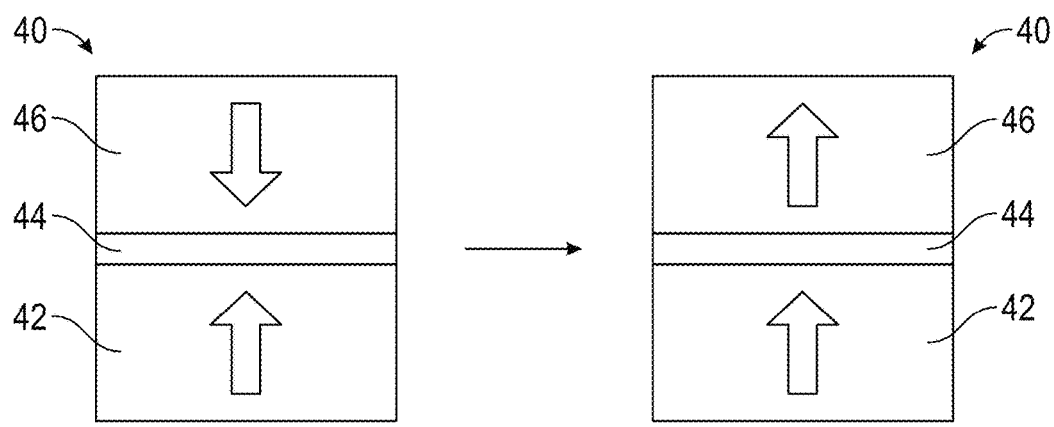
FIGS. 2 and 3 illustrate an anti-parallel to parallel program change and a parallel to anti-parallel program change in a memory cell, respectively.
Figure 3:
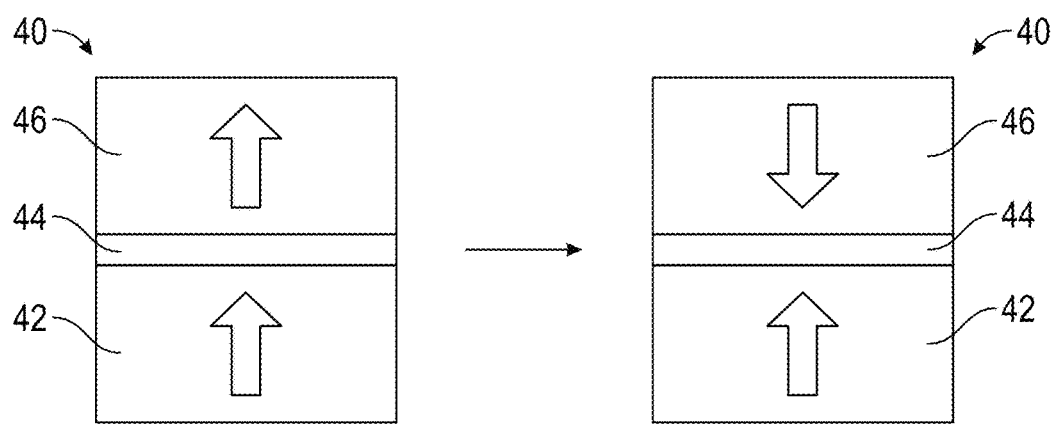

During programming, a write operation is sent to the MTJ stack 40 to change the alignment of the free layer 46 relative to the fixed layer 42. The magnitude of the write operation may be different depending on the program direction, where the "program direction" refers to whether the free layer 46 is changed from a parallel pole (where the magnetic field of the fixed layer 42 and the free layer 46 are aligned along parallel vectors) to an anti-parallel pole, or vice versa. In an exemplary embodiment, a program direction change from parallel to anti-parallel may use a charge on the word line 20 and on the source line 30, with essentially no voltage on the bit line 38. A program direction change from anti-parallel to parallel may use a charge on the word line 20 and the bit line 38, with essentially no charge on the source line 30. However, the electrical charge to change from parallel to anti-parallel may be larger or smaller than the electrical charge to change from anti-parallel to parallel. FIG. 2 illustrates one program direction where the free layer 46 changes from anti-parallel to parallel, relative to the fixed layer 42, and FIG. 3 illustrates the other program direction where the fee layer 46 changes from parallel to anti-parallel relative to the fixed layer 42.

Figure 4:
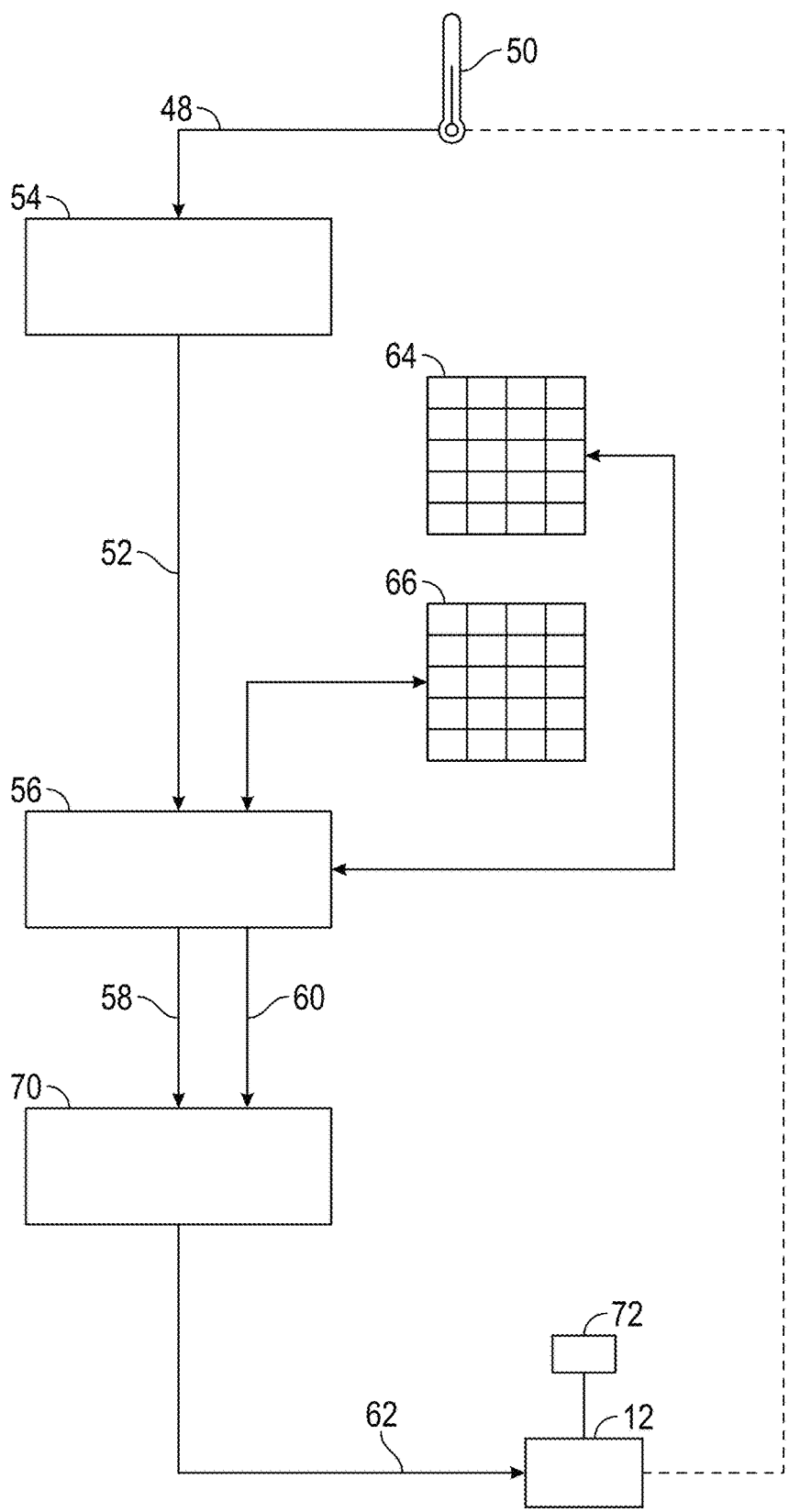
FIG. 4 is a schematic diagram of a memory cell writing process.

Reference is made to FIG. 4, with continuing reference to FIG. 1, where FIG. 4 illustrates an embodiment of write logic for the memory cell 12. A temperature sensor 50 is formed within the integrated circuit 10, where the temperature sensor 50 is positioned such that it can be used to determine the temperature at the memory cell 12. In an exemplary embodiment, the temperature sensor 50 is a thermocouple, and the temperature sensor 50 is positioned close enough to the memory cell 12 that the temperature at the temperature sensor 50 can be calibrated to indicate the temperature at the memory cell 12. In an exemplary embodiment, the memory cell 12 is part of a memory bank (not illustrated), and one or more temperature sensors 50 may be calibrated to indicate the temperature of the different memory cells 12 within the memory bank. In some embodiments, one temperature sensor 50 is used to determine the temperature for a chip, a block of cells, or a memory bank, (not illustrated) where all the individual memory cells 12 within the chip, block of cells, or memory bank are determined to be at the temperature indicated by the temperature sensor 50. The temperature sensor 50 sends a temperature signal 48 that represents the temperature in the memory cell 12.

A temperature determination circuit 54 uses the temperature signal 48 to determine a memory cell temperature 52. A write operation determination circuit 56 uses the memory cell temperature 52 to determine a pulse number 58 and/or a pulse duration 60 for a write operation 62. The write operation 62 is an electrical signal or charge that programs the memory cell 12. The pulse number 58 and/or pulse duration 60 are determined based on a set voltage that is substantially constant for a program direction, where higher pulse numbers 58 and/or pulse durations 60 produce a write operation 62 that has increased force for programming the MTJ stack 40. The "set voltage," as used herein, refers to a voltage that is "constant", where a constant changes by about 10 percent or less, and where the circuits that produce the set voltage or any other constant voltage are designed to produce a voltage that does not change. However, due to process variable the set voltage or other constant voltages may change slightly, such as from the start to the end of an electrical pulse, or from one pulse to another, or depending on variations in a power source (such as a charge on a battery). Because the set voltage is constant for a program direction, effective programming is independent of the memory cell temperature 52. The memory cell 12 may require a larger write operation 62 as the memory cell temperature 52 drops in some embodiments. The pulse number 58 is the number of electrical pulses at the set voltage that are determined to program the memory cell 12 by changing the alignment of free layer 46 relative to the fixed layer 42. The pulse duration 60 is the length of time of the write operation 62 at the set voltage that is determined to program the memory cell 12 by changing the alignment of free layer 46 relative to the fixed layer 42.

In some embodiments, the set voltage is the same for both program directions, i.e., for the (i) parallel to anti-parallel program direction and for the (ii) anti-parallel to parallel program direction. However, the set voltage may depend on the program direction in some embodiments, so the set voltage may be different for the (i) parallel to anti-parallel program direction and the (ii) anti-parallel to parallel program direction. If the set voltage is different for the (i) parallel to anti-parallel program direction and the (ii) anti-parallel to parallel program direction, different digital circuits may be used for the write operation 62 for each program direction. In alternate embodiments, one digital circuit or several digital circuits may be used to provide and adjust the set voltage for (i) the parallel to anti-parallel program direction and for (ii) the anti-parallel to parallel program direction. The determination of the pulse number 58 and the pulse duration 60 may depend on the program direction in some embodiments, where a different pulse number 58 and/or pulse duration 60 may be determined at the same memory cell temperature 52 for different program directions. However, the pulse number 58 and the pulse duration 60 may be independent of the program direction in other embodiments.

The write operation determination circuit 56 may reference a parallel to anti-parallel look up table 64 and an anti-parallel to parallel look up table 66 to determine the pulse number 58 and/or the pulse duration 60 in some embodiments, but in alternate embodiments an algorithm or other determination technique may be used to determine the pulse number 58 and/or the pulse duration 60. The algorithm may be a linear equation, a quadratic equation, or other curve-fitting equations that approximate a required write operation 62 to memory cell temperature 52 graph. The algorithm may include a rounding feature so the pulse number 58 is a whole number (excluding zero).

The pulse number 58 may be one pulse, two pulses, three pulses, or more, and the pulse duration 60 may be the same or different for each pulse in embodiments with more than one pulse in the write operation 62. For example, for a pulse number 58 of 3, the first pulse may have a duration number 60 of about 100 nanoseconds, the second pulse may have a duration number 60 of about 200 nanoseconds, and the third pulse may have a duration number 60 of about 150 nanoseconds. In another embodiment, all three of the pulses may have the same duration number 60, and the duration number 60 may change with the memory cell temperature 52. In some embodiments, both the pulse number 58 and the duration number 60 may change depending on the memory cell temperature 52, but in other embodiments only one of the pulse number 58 or pulse duration 60 may change depending on the memory cell temperature 52.

A pulse generation circuit 70 may use digital circuits to produce the write operation 62, where the write operation 62 is delivered to the memory cell 12. The set voltage is fixed at a constant value for each program direction, and this allows the pulse generation circuit 70 to exclusively use digital circuits to produce and write operation 62 because no changes in voltage are needed. The write operation 62 utilizes the pulse number 58 and pulse duration 60 at about the set voltage to change the alignment of the poles on the memory cell 12 (which may be a MTJ memory cell in some embodiments.) An optional write verification circuit 72 may be used to verify the writing of the memory cell 12 was successful. The use of a set voltage for the write operation 62 simplifies the circuitry and allows for the use of all digital circuits for generating the write operation 62, as mentioned above. The simplified circuitry can reduce the foot print of the circuitry for the pulse generation circuit 70, and thereby reduce the size of the integrated circuit 10. Changing the pulse number 58 and/or pulse duration 60 to optimize the writing process for the memory cell based on the memory cell temperature 52 allows for accurate memory bank operations at varying temperatures.

Programming the memory cell 12 may include holding a word line voltage of the word line 20 constant while sending the write operation 62 to the source line 30 or the bit line 38, depending on the program direction. If the write operation 62 is sent to the source line 30, a bit line voltage of the bit line 38 may be held at about zero in some embodiments, but the bit line voltage may be held at other voltages as well. In a similar manner, if the write operation 62 is sent to the bit line 38, a source line voltage of the source line 30 may be held at about zero or at other voltages. In alternate embodiments, the source line voltage and the bit line voltage are held constant, where one of the source line voltage or the bit line voltage may be about zero volts (depending on the program direction), and the write operation 62 is sent to the word line 20. Other programming protocols may also be used in alternate embodiments.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of programming a memory cell comprising:
    determining a memory cell temperature for the memory cell within an integrated circuit;
    determining a pulse number, wherein the pulse number is a number of electrical pulses at a set voltage required to program the memory cell at the memory cell temperature, and wherein the pulse number is dependent on the memory cell temperature; and
    programming the memory cell with a write operation, wherein the write operation comprises the pulse number of electrical pulses at the set voltage.

2. The method of claim 1 wherein:
    determining the memory cell temperature comprises determining the memory cell temperature for a magnetoresistive random access memory cell.

3. The method of claim 2 further comprising:
    determining a program direction for the memory cell, wherein the program direction comprises programming the memory cell to a parallel mode or programming the memory cell to an anti-parallel mode.

4. The method of claim 3 wherein determining the pulse number comprises determining the pulse number for the program direction.

5. The method of claim 3 wherein determining the pulse number comprises determining the pulse number wherein the set voltage depends on the program direction.

6. The method of claim 1 wherein programming the memory cell with a write operation comprises changing a free layer of the memory cell from a parallel pole with a fixed layer to an anti-parallel pole with the fixed layer.

7. The method of claim 1 wherein determining the pulse number comprises determining the pulse number at the set voltage, wherein the set voltage is independent of the memory cell temperature, and wherein the set voltage is about constant for a program direction.

8. The method of claim 1 wherein the write operation for the memory cell comprises:
    holding a word line voltage constant, wherein the word line voltage is the voltage of a word line, and wherein the word line is in electrical communication with the memory cell; and
    sending the write operation through one of a source line or a bit line, wherein the source line is in electrical communication with the memory cell and the bit line is in electrical communication with the memory cell.

9. The method of claim 1 wherein the write operation for the memory cell comprises:
    sending the write operation through a word line, wherein the word line is in electrical communication with the memory cell;
    controlling a source line voltage of a source line at a constant voltage, wherein the source line is in electrical communication with the memory cell; and
    controlling a bit line voltage of a bit line at a constant voltage, wherein the bit line is in electrical communication with the memory cell.

10. The method of claim 1 further comprising:
    determining a pulse duration for the memory cell, wherein the pulse duration is the duration of the electrical pulse.

11. The method of claim 10 wherein determining the pulse duration comprises determining the pulse duration for each electrical pulse of the pulse number.

12. The method of claim 1 wherein the write operation for the memory cell comprises generating and sending the write operation with a plurality of circuits, wherein the plurality of circuits for generating and sending the write operation are exclusively digital.

13. A method of programming a memory cell comprising:
    determining a memory cell temperature for the memory cell;
    determining a pulse duration, wherein the pulse duration is a duration of a write operation required to program the memory cell at the memory cell temperature; and
    programming the memory cell with the write operation, wherein the write operation is at a set voltage that is independent of the memory cell temperature, wherein the set voltage is about constant for a program direction, and wherein the write operation comprises an electrical pulse at the pulse duration and at the set voltage.

14. The method of claim 13 wherein determining the memory cell temperature comprises determining the memory cell temperature for a magnetoresistive random access memory cell.

15. The method of claim 13 wherein the write operation for the memory cell comprises programming the memory cell wherein the write operation comprises more than one electrical pulse at the set voltage.

16. The method of claim 15 wherein determining the pulse duration comprises determining the pulse duration for each electrical pulse at the set voltage, wherein the pulse duration varies from one electrical pulse at the set voltage to another electrical pulse at the set voltage.

17. The method of claim 13 wherein determining the pulse duration comprises referring to one of a parallel to anti-parallel look up table or an anti-parallel to parallel look up table.

18. The method of claim 13 further comprising:
    determining a program direction for the memory cell, wherein the program direction comprises programming the memory cell to a parallel mode or programming the memory cell to an anti-parallel mode; and
    wherein programming the memory cell comprises programming the memory cell wherein the set voltage depends on the program direction.

19. The method of claim 13 further comprising:
    determining a program direction for the memory cell; and
    wherein determining the pulse duration for the memory cell comprises determining the pulse duration for the memory cell at the memory cell temperature, wherein the pulse duration depends on the program direction.

20. An integrated circuit comprising:
a memory cell;
a memory cell temperature sensing element configured to determine a memory cell temperature of the memory cell; and
a write operation determination circuit configured to generate a write operation comprising one or more electrical pulses at a set voltage, wherein the set voltage is about constant for a program direction, wherein the set voltage is independent of the memory cell temperature, and wherein the number of electrical pulses is dependent on the memory cell temperature.

* * * * *